US009653410B1

(12) United States Patent
Holmes et al.

(10) Patent No.: US 9,653,410 B1
(45) Date of Patent: May 16, 2017

(54) TRANSISTOR WITH SHIELD STRUCTURE, PACKAGED DEVICE, AND METHOD OF MANUFACTURE

(71) Applicant: FREESCALE SEMICONDUCTOR, INC., Austin, TX (US)

(72) Inventors: Damon Holmes, Scottsdale, AZ (US); David Burdeaux, Tempe, AZ (US); Partha Chakraborty, Tempe, AZ (US); Ibrahim Khalil, Munich (DE); Hernan Rueda, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/070,248

(22) Filed: Mar. 15, 2016

(51) Int. Cl.
| H01L 23/58 | (2006.01) |
| H01L 23/552 | (2006.01) |
| H01L 23/528 | (2006.01) |
| H01L 23/522 | (2006.01) |
| H01L 23/66 | (2006.01) |
| H01L 27/02 | (2006.01) |
| H01L 21/8234 | (2006.01) |
| H01L 21/3205 | (2006.01) |
| H01L 21/768 | (2006.01) |

(52) U.S. Cl.
CPC ...... *H01L 23/552* (2013.01); *H01L 21/32051* (2013.01); *H01L 21/76802* (2013.01); *H01L 21/76877* (2013.01); *H01L 21/823475* (2013.01); *H01L 23/528* (2013.01); *H01L 23/5226* (2013.01); *H01L 23/66* (2013.01); *H01L 27/0203* (2013.01); *H01L 2223/6644* (2013.01)

(58) Field of Classification Search
CPC ............. H01L 23/552; H01L 21/32051; H01L 21/76802; H01L 21/76877; H01L 21/823475; H01L 23/5226; H01L 23/528; H01L 23/66; H01L 27/0203; H01L 23/5225; H01L 2223/6644; H01L 27/3272; H01L 2924/3025; H01L 2225/06537
See application file for complete search history.

(56) References Cited

U.S. PATENT DOCUMENTS

| 5,151,770 A | 9/1992 | Inoue |
| 5,309,012 A * | 5/1994 | Jex ........................ H01L 27/115 257/314 |
| 5,742,082 A | 4/1998 | Tehrani et al. |

(Continued)

*Primary Examiner* — Yosef Gebreyesus
(74) *Attorney, Agent, or Firm* — Charlene R. Jacobsen

(57) ABSTRACT

A transistor includes a semiconductor substrate having an intrinsic active device, a first terminal, and a second terminal. The transistor also includes an interconnect structure formed of multiple layers of dielectric material and electrically conductive material on an upper surface of the semiconductor substrate. The interconnect structure includes a pillar, a tap interconnect, and a shield structure formed from the electrically conductive material. The pillar electrically contacts the first terminal, extends through the dielectric material, and connects to a first runner. The tap interconnect electrically contacts the second terminal, extends through the dielectric material, and connects to a second runner. The shield structure extends from a shield runner through the dielectric material toward the semiconductor substrate. The shield structure is positioned between the pillar and the tap interconnect to limit feedback capacitance between the tap interconnect and the pillar.

17 Claims, 9 Drawing Sheets

(56) References Cited

U.S. PATENT DOCUMENTS

| | | | |
|---|---|---|---|
| 7,135,766 B1 * | 11/2006 | Costa | H01L 23/3677 |
| | | | 257/700 |
| 7,446,411 B2 * | 11/2008 | Condie | H01L 23/047 |
| | | | 257/710 |
| 7,859,047 B2 | 12/2010 | Kraft et al. | |
| 8,513,782 B2 | 8/2013 | Bakalski et al. | |
| 8,680,615 B2 | 3/2014 | Mitra et al. | |
| 9,209,259 B2 | 12/2015 | Mitra et al. | |
| 9,462,674 B1 * | 10/2016 | Fakhruddin | G06F 17/5045 |
| 2004/0124524 A1 | 7/2004 | Aumuller et al. | |
| 2011/0157445 A1 * | 6/2011 | Itonaga | H01L 21/76898 |
| | | | 348/308 |
| 2014/0002188 A1 * | 1/2014 | Chen | H03F 3/19 |
| | | | 330/250 |

* cited by examiner

TRANSISTOR WITH SHIELD STRUCTURE, PACKAGED DEVICE, AND METHOD OF MANUFACTURE

TECHNICAL FIELD OF THE INVENTION

The present invention relates generally to field effect transistors. More specifically, the present invention relates to a field effect transistor having a shield structure between the input and output of the active device, a packaged semiconductor device with the field effect transistor therein, and a method of manufacturing such a field effect transistor.

BACKGROUND OF THE INVENTION

A typical high power semiconductor device package may include one or more input leads, one or more output leads, one or more transistors, wirebonds coupling the input lead(s) to the transistor(s), and wirebonds coupling the transistor(s) to the output lead(s). A field effect transistor (FET) in such a high power semiconductor device package may include interdigitated drain and gate runners. The gate of the FET is driven by an input signal tapped from the gate runner. The tapping of the gate runner can add parasitic feedback capacitance that may reduce amplifier stability and reduce gain.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
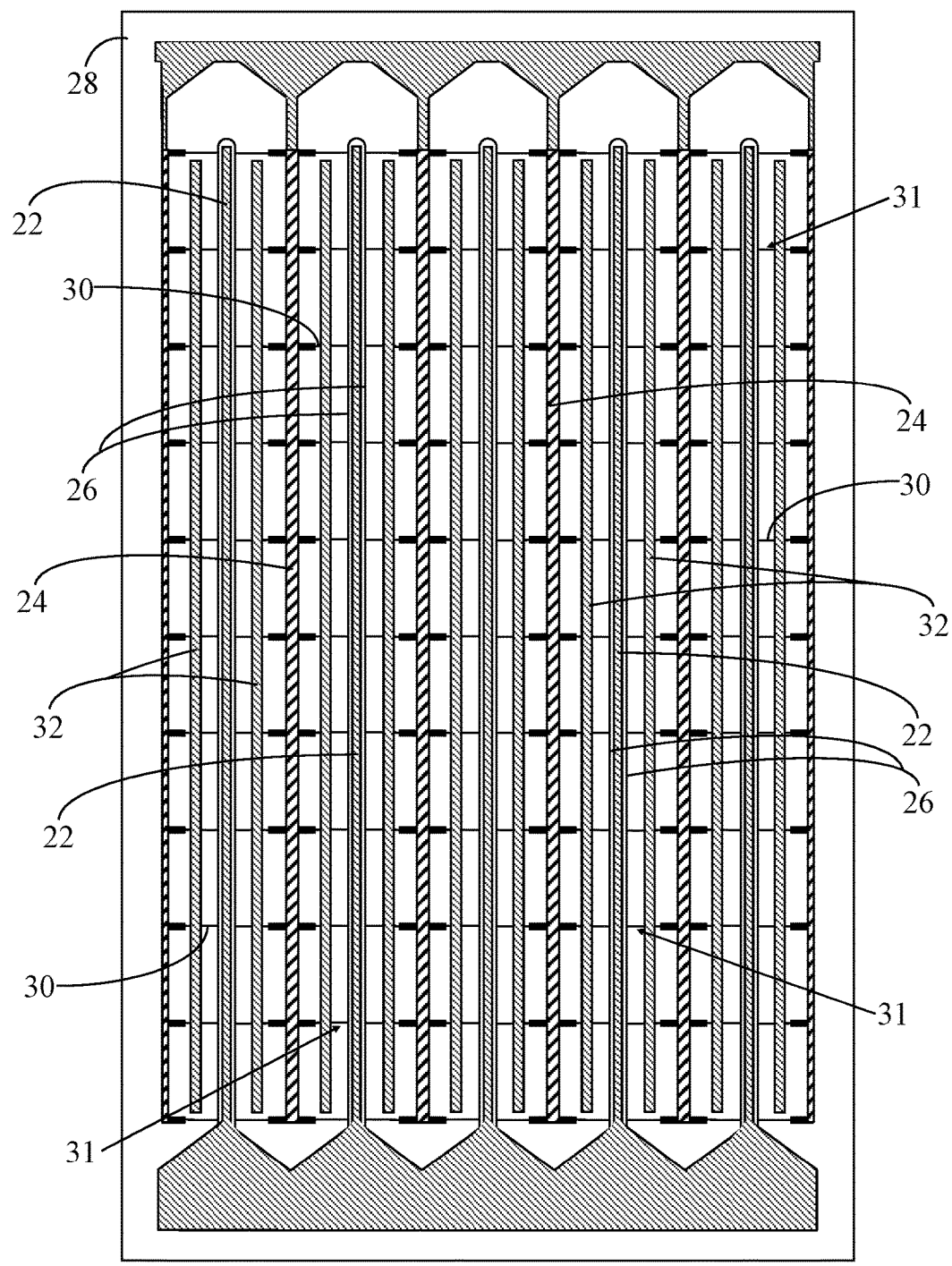
FIG. 1 shows a simplified top view of an example of a transistor having interdigitated drain and gate fingers.

In overview, embodiments disclosed herein entail a transistor, having a shield structure within an interconnect structure of the transistor, a packaged semiconductor device having such a transistor, and a method of manufacturing the transistor. More specifically, embodiments can include multiple shield structures strategically located along the runners of a multiple runner interdigitated transistor near positions where the input interconnections approach the output interconnections (tap locations). The shield structure includes several layers of grounded electrically conductive material, i.e., metal, and vias extending through the interconnect structure to block electric fields between the input signal tapped from a first runner and the output signal carried to a second runner of the transistor. The geometry of the shield structure is configured to be small to minimize additional input and output capacitance contributions from the shield structure. The geometry of the shield structure effectively increases the gain of the active device (e.g., transistor) without degrading stability by reducing feedback capacitance.

The following description entails the implementation of a shield structure within an interconnect structure of a field effect transistor (FET) in a non-limiting fashion. Multiple shield structures may be strategically located along the gate runner of a multiple runner interdigitated FET and extending through the interconnect structure near positions where the input connections from a gate runner approach the output interconnections to a drain runner. It should be understood, however, that the shield structure may be implemented within a wide variety of unipolar and bipolar transistor technologies.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

FIG. 1 shows a simplified top view of an example of a transistor 20 having interdigitated drain and gate runners 22, 24. That is, drain and gate runners 22, 24 are closely positioned relative to one another in an alternating arrangement. Gates 26 generally surround drain regions (not visible) formed within a semiconductor substrate 28 of an intrinsic device underlying drain and gate runners 22, 24. Transistor 20 further includes a plurality of tap interconnects 30 formed from electrically conductive material, typically metal. Tap interconnects 30 are electrically connected between gate runners 24 and gate taps or gate electrodes of gates 26 formed within semiconductor substrate 28. The positions at which tap interconnects 30 are located are referred to herein as tap locations 31. Transistor 20 may include shield runners 32 interposed between each pair of drain and gate runners 22, 24 that may reduce some feedback capacitance between drain and gate runners 22, 24. The interdigitated drain, gate, and shield runners 22, 24, 32 may be formed in one or more metal layers above semiconductor substrate 28.

Figure 2:
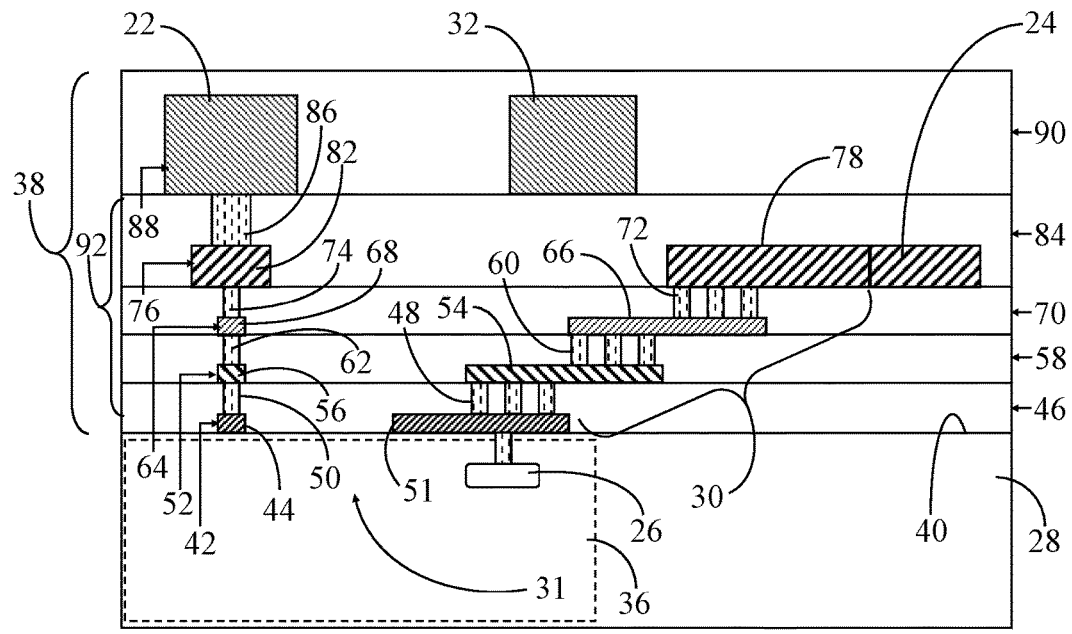
FIG. 2 shows a side sectional view of a portion of a prior art transistor.

Referring now to FIG. 2, FIG. 2 shows a side sectional view of a portion of a prior art transistor 34. Transistor 34 includes the interdigitating configuration of drain and gate runners 22, 24 with shield runners 32 as described and illustrated in FIG. 1. Transistor 34 includes semiconductor substrate 28 having an intrinsic active device, e.g., FET 36, formed therein, represented generally by a dashed line box. An interconnect structure 38 is formed on an upper surface 40 of semiconductor substrate 28. Interconnect structure 38 may be formed of multiple layers of dielectric material and electrically conductive material. By way of example, a bottom conductive layer 42 (represented by dark upwardly and rightwardly directed narrow hatching) is suitably formed on upper surface 40 of semiconductor substrate to include gate electrode 26 and a drain electrode 44. Of course, other structures may be formed on upper surface 40 of semiconductor substrate 28 as well that are not illustrated herein for simplicity.

A bottom dielectric material layer 46 is formed over bottom conductive layer 42. Electrically conductive vias 48, 50 may be suitably formed extending through bottom dielectric material layer 46. By way of example, one or more electrically conductive vias 48 extend through bottom dielectric material layer 46 and are in electrical contact with a bottom gate contact 51, which in turn is in electrical communication with gate 26 of FET 36. Likewise, electrically conductive via 50 extends through bottom dielectric layer 46 and is in electrical contact with a bottom drain contact 44, which in turn is in electrical communication with a drain region (not shown) of FET 36.

A first electrically conductive layer 52 (represented by downwardly and rightwardly directed wide hatching) is suitably formed on bottom dielectric material layer 46. A tap interconnect segment 54 of first electrically conductive layer 52 is in electrical contact with conductive vias 48 and a drain segment 56 is in electrical contact with conductive vias 50. A first dielectric material layer 58 is formed over tap interconnect segment 54 and drain segment 56 of first electrically conductive layer 52. Electrically conductive vias 60, 62 may be suitably formed extending through first dielectric material layer 58. By way of example, one or more electrically conductive vias 60 extend through first dielectric material layer 58 and are in electrical contact with tap interconnect segment 54. Likewise, electrically conductive via 62 extends through first dielectric material layer 58 and is in electrical contact with drain segment 56. The conductive layers (beginning with conductive layer 52) and the dielectric material layers (beginning with dielectric material layer 58) are distinguished from and denote their build-up above the bottommost conductive and dielectric material layers by the nomenclature "first," "second," "third," and so forth.

A second electrically conductive layer 64 (represented by rightwardly and upwardly directed narrow hatching) is formed on first dielectric material layer 58. A tap interconnect segment 66 of second electrically conductive layer 64 is in electrical contact with conductive vias 60 and a drain segment 68 is in electrical contact with conductive vias 62. A second dielectric material layer 70 is formed over tap interconnect segment 66 and drain segment 68 of second electrically conductive layer 64. Electrically conductive vias 72, 74 may be suitably formed extending through second dielectric material layer 70. By way of example, one or more electrically conductive vias 72 extend through second dielectric material layer 70 and are in electrical contact with tap interconnect segment 66. Likewise, electrically conductive via 74 extends through second dielectric material layer 58 and is in electrical contact with drain segment 68.

A third electrically conductive layer 76 (represented by rightwardly and upwardly directed wide hatching) is formed on second dielectric material layer 70. A main gate tap transmission line 78 and gate runner 24 are formed in third electrically conductive layer 76 and are in electrical contact with conductive vias 72. Thus, collectively, bottom gate contact 51, vias 48, tap interconnect segment 54, vias 60, tap interconnect segment 66, vias 72, and gate tap transmission line 78 yield one of tap interconnects 30 between gate 26 and gate runner 24. A drain segment 82 is in electrical contact with conductive via 74. A third dielectric material layer 84 is formed over gate tap transmission line 78, gate runner 24, and drain segment 82 of third electrically conductive layer 76. In this example, an electrically conductive via 86 may be suitably formed extending through third dielectric material layer 84 and is in electrical contact with drain segment 82.

A fourth electrically conductive layer 88 (represented by rightwardly and downwardly directed narrow hatching) is formed on third dielectric material layer 84. In this example, drain runner 22 and shield runner 32 are formed in fourth electrically conductive layer 88. Thereafter, a fourth dielectric layer 90 may be formed over drain runner 22 and shield runner 32. Drain runner 22 is in electrical contact with electrically conductive via 86. Thus, collectively the combination of bottom drain contact 44, via 50, drain segment 56, via 62, drain segment 68, via 74, drain segment 82, and via 86 yields a drain pillar 92 for transistor 34 that electrically interconnects a drain region (not shown) of intrinsic FET 36 to drain runner 22.

Gate 26 of intrinsic FET 36 is driven by an input signal tapped from gate runner 24 via tap interconnect 30 to gate 26. The input signal tapped from gate runner 24 can add parasitic feedback capacitance to an output signal from drain runner 22. This parasitic feedback capacitance can reduce amplifier stability and reduce gain. The problem of feedback capacitance is exacerbated at positions wherein the input metallization approaches the output metallization. Again, these positions are referred to as tap locations 31. Thus, tap locations 31 are the positions where tap interconnects 30 approach drain pillar 92 within interconnect structure 38. As discussed above, tap locations 31 are also depicted in FIG. 1 where it can be seen that FET 20 having interdigitated drain and gate runners 22, 24 can include a multiplicity of tap locations 31. Referring back to FIG. 2, it should be readily observed that shield runner 32 present in fourth electrically conductive layer 88 may shield drain runner 22 from some parasitic feedback capacitance. However, drain pillar 92 underlying drain runner 22 within interconnect structure 38 is not shielded from tap interconnect 30, gate tap transmission line 78, and gate runner 24.

Figure 3:
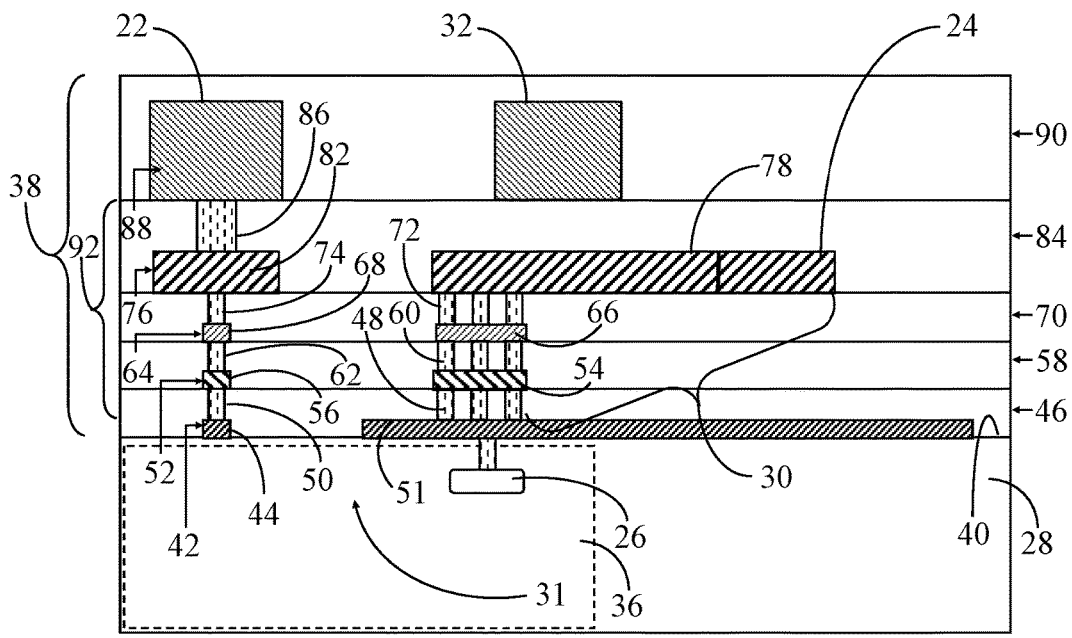
FIG. 3 shows a side sectional view of a portion of another prior art transistor.

FIG. 3 shows a side sectional view of a portion of another prior art transistor 96. Transistor 96 also includes interconnect structure 38 formed of multiple layers of dielectric material and electrically conductive material. Hence, the same reference numerals that were used with transistor 34 in FIG. 2 are also associated with corresponding components within transistor 96. Consequently, a description of the various layers and structures within interconnect structure 38 of transistor 96 will not be repeated herein for brevity. Nevertheless, it can be readily observed that drain pillar 92 underlying drain runner 22 within interconnect structure 38 is not shielded from tap interconnect 30, gate tape transmission line 78, and gate runner 24.

Embodiments discussed below embodiments entail the inclusion of multiple shield structures strategically located along the gate finger of a multi-finger interdigitated transistor near positions where the input interconnections approach the output interconnections (e.g., at tap locations 31). The shield structure includes several layers of grounded electrically conductive material, i.e., metal, and vias to block electric fields between the input signal tapped from an input runner and the output signal at the output runner of a transistor. The geometry of the shield structure is configured to be small to minimize additional input and output capacitance contributions from the shield structure. The geometry of the shield structure effectively increases the gain of the active device (e.g., transistor) without degrading stability by reducing the feedback capacitance caused by the tap interconnect between the input runners and an input terminal of the transistor.

Figure 4:
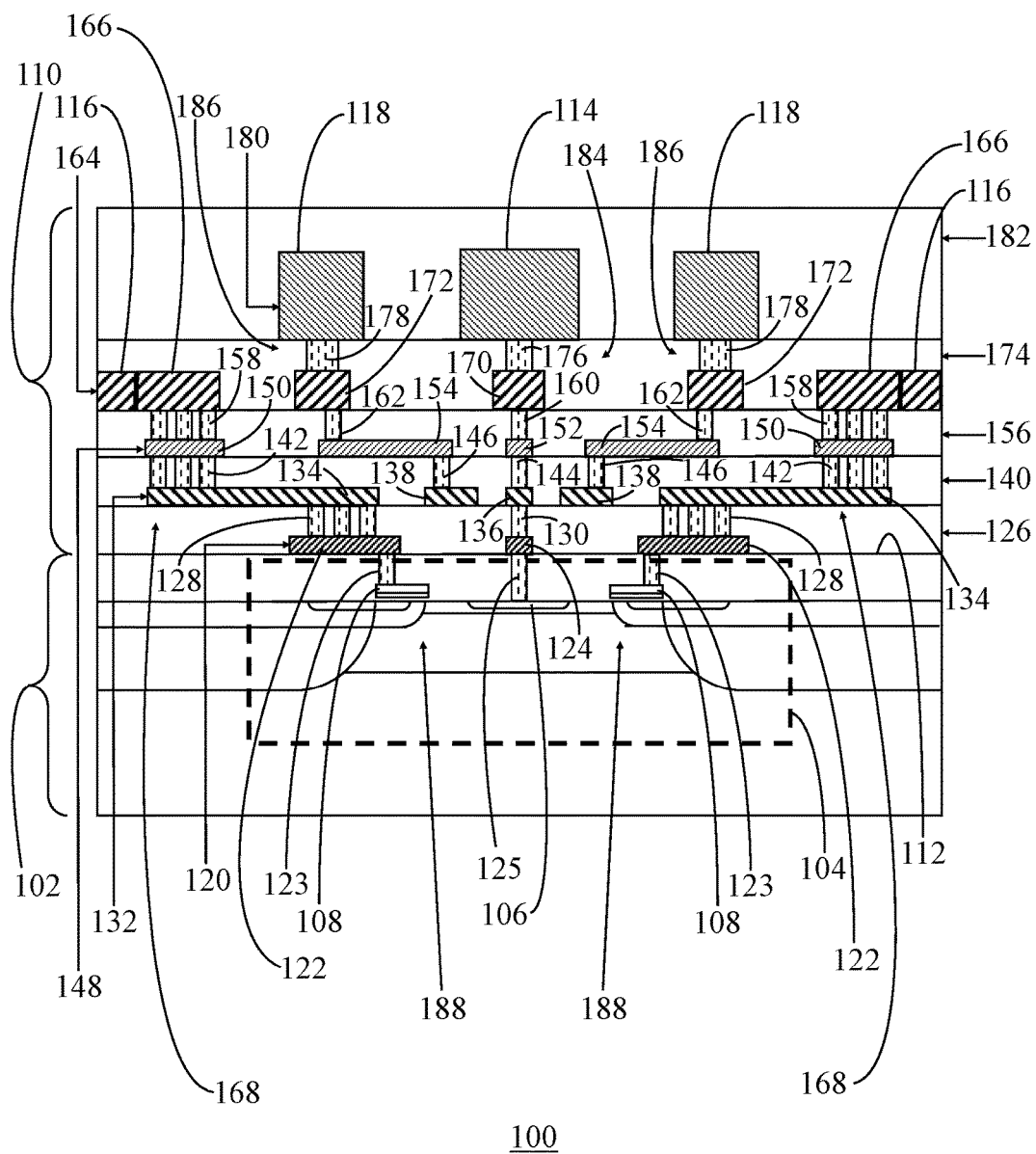
FIG. 4 shows a side sectional view of a portion of a transistor in accordance with an embodiment.

Referring now to FIG. 4, FIG. 4 shows a side sectional view of a portion of a transistor 100 in accordance with an embodiment. Transistor 100 includes a semiconductor substrate 102 having an intrinsic active device, e.g., a FET 104, formed therein, represented generally by a dashed line box. FET 104 within semiconductor substrate 102 includes, among other features, a first terminal, referred to herein as a drain region 106 and a second terminal, referred to herein as gate electrodes 108. Further details of FET 104 are known to those skilled in the art and are therefore not described herein for brevity. It bears repeating that although a FET design is discussed herein, a wide variety of unipolar and bipolar transistor technologies may alternatively be implemented.

An interconnect structure 110 is formed on an upper surface 112 of semiconductor substrate 102. In general, interconnect structure 110 of transistor 100 includes a plurality of interdigitated first and second runners, i.e., drain and gate runners 114, 116. Additionally, interconnect structure 110 includes a plurality of shield runners 118 interposed between each drain and gate runner 114, 116. Only a single drain runner 114, two gate runners 116, and two shield runners 118 are shown in the side sectional view of FIG. 4 for simplicity of illustration. It should be understood however, that transistor 100 may be configured to include the multiplicity of drain, gate, and shield runners as represented by transistor 20 in FIG. 1. Additionally, gate electrodes 108 may be structured on opposing sides of drain runners 114 as also shown in FIG. 1.

Interconnect structure 110 may be formed of multiple layers of dielectric material and electrically conductive material. In the illustrated configuration, a bottom conductive layer 120 (represented by dark upwardly and rightwardly directed narrow hatching) is suitably formed on upper surface 112 of semiconductor substrate 102 to include bottom tap segments 122 (two shown) electrically connected to gate electrodes 108 by way of electrically conductive vias 123, and bottom drain segments 124 (one shown) electrically connected to drain region 106 by way of an electrically conductive via 125. Of course, other structures may be formed on upper surface 112 of semiconductor substrate 102 that are not illustrated herein for simplicity.

A bottom dielectric material layer 126 is formed over bottom conductive layer 120. Electrically conductive vias 128, 130 may be suitably formed extending through bottom dielectric material layer 126. By way of example, electrically conductive vias 128 extend through bottom dielectric material layer 126 and are in electrical contact with each of bottom tap segments 122. Likewise, electrically conductive via 130 extends through bottom dielectric layer 126 and is in electrical contact with bottom drain segments 124.

A first electrically conductive layer 132 (represented by downwardly and rightwardly directed wide hatching) is suitably formed on bottom dielectric material layer 126. First electrically conductive layer 132 includes tap interconnect segments 134 in electrical contact with conductive vias 128. First electrically conductive layer 132 further includes a drain segment 136 in electrical contact with conductive via 130. Still further, first electrically conductive layer 132 includes a shield segment 138 interposed between tap interconnect segments 134 and drain segment 136.

A first dielectric material layer 140 is formed over tap interconnect segments 134, drain segment 136, and shield segments 138 of first electrically conductive layer 132. Electrically conductive vias 142, 144, 146 may be suitably formed extending through first dielectric material layer 140. By way of example, one or more electrically conductive vias 142 extend through first dielectric material layer 140 and are in electrical contact with each of tap interconnect segments 134. Likewise, electrically conductive via 144 extends through first dielectric material layer 140 and is in electrical contact with drain segment 136. Likewise, electrically conductive vias 146 extend through first dielectric material layer 140 and are in electrical contact with each of shield segments 138. The conductive layers (beginning with conductive layer 132) and the dielectric material layers (beginning with dielectric material layer 140) are distinguished from and denote their build-up above the bottommost conductive and dielectric material layers by the nomenclature "first," "second," "third," and so forth.

A second electrically conductive layer 148 (represented by rightwardly and upwardly directed narrow hatching) is formed on first dielectric material layer 140. Second electrically conductive layer 148 includes tap interconnect segments 150 in electrical contact with conductive vias 142 and a drain segment 152 in electrical contact with conductive via 144. Additionally, second electrically conductive layer 148 includes shield segments 154 interposed between tap interconnect segments 150 and drain segment 152. A second dielectric material layer 156 is formed over tap interconnect segments 150, drain segment 152, and shield segments 154 of second electrically conductive layer 148. Electrically conductive vias 158, 160, 162 may be suitably formed extending through second dielectric material layer 156. By way of example, one or more electrically conductive vias 158 extend through second dielectric material layer 156 and are in electrical contact with each of tap interconnect segments 150. Likewise, electrically conductive via 160 extends through second dielectric material layer 156 and is in electrical contact with drain segment 152. Additionally, electrically conductive vias 162 extend through second dielectric material layer 156 and are in electrical contact with each of shield segments 154.

A third electrically conductive layer 164 (represented by rightwardly and upwardly directed wide hatching) is formed on second dielectric material layer 156. Gate runners 116 and main gate tap transmission lines 166 extending from gate runners 116 are formed in third electrically conductive layer 164. Gate tap transmission lines 166 are in electrical contact with conductive vias 158. Thus, collectively, bottom tap segment 122, vias 128, tap interconnect segments 134, vias 142, tap interconnect segment 150, vias 158, and gate fingers 166 yield individual tap interconnects 168 between bottom metal segments 122 and gate runners 116. Only two tap interconnects 168 are illustrated in FIG. 4 for clarity. However, it should be understood that transistor 100 may include a plurality of tap interconnects 168 in accordance with a configuration of interdigitated drain and gate runners like that shown in FIG. 1.

A drain segment 170 is in electrical contact with conductive via 160. Shield segments 172 interposed between gate fingers 166 and drain segment 170 are in electrical contact with conductive vias 162. A third dielectric material layer 174 is formed over gate fingers 166, gate runners 116, drain segment 170, and shield segments 172 of third electrically conductive layer 164. In this example, an electrically conductive via 176 may be suitably formed extending through third dielectric material layer 174 and is in electrical contact with drain segment 170. Similarly, electrically conductive vias 178 may be suitably formed extending through third dielectric material layer 174 and are in electrical contact with each of shield segments 172.

A fourth electrically conductive layer 180 (represented by rightwardly and downwardly directed narrow hatching) is formed on third dielectric material layer 174. In this example, drain runner 114 and shield runners 118 are formed in fourth electrically conductive layer 180. Thereafter, a fourth dielectric material layer 182 may be formed over drain runner 114 and shield runner 118. Drain runner 114 is in electrical contact with electrically conductive via 176. Thus, collectively, the combination of bottom drain segment 124, via 130, drain segment 136, via 144, drain segment 152, via 160, drain segment 170, and via 176 yield a drain pillar 184 for transistor 100 that electrically interconnects drain region 106 of intrinsic FET 104 to drain runner 114.

Each of shield runners 118 is in electrical contact with electrically conductive vias 178. Thus, collectively, the combination of one of shield segments 138 connected to conductive vias 146, one of shield segments 154 connected to conductive vias 162, and one of shield segments 172 connected to conductive vias 178 yields a shield structure 186 (two shown) that is electrically connected to one of shield runners 118.

Shield structures 186 are laterally spaced apart from and located on opposing sides of drain pillar 184. Each of shield structures 186 is electrically isolated from drain pillar 184 by dielectric material layers 140, 156, 174 182. Similarly, shield structures 186 are laterally spaced apart and are electrically isolated from tap interconnects 168 by dielectric material layers 140, 156, 174 182. Further, shield structures 186 extend through dielectric material layers 140, 156, 174 toward upper surface 112 of semiconductor substrate 102. However, shield structures 186 are vertically spaced apart and electrically isolated from upper surface 112 of semiconductor substrate 102 by bottom dielectric material layer 126. It should be readily observed, however, that each of tap interconnects 168 extends laterally toward drain pillar 184 below their associated shield runner 118 within interconnect structure 110. Like tap interconnects 168, each of shield structures 186 also extends laterally toward drain pillar 184 in the dielectric material layers 140, 156, 174 so that shield structures 186 remain positioned between drain pillar 184 and tap interconnects 168.

Gate electrodes 108 of intrinsic FET 104 are driven by an input signal tapped from gate runners 116 via tap interconnects 168 to bottom tap segments 122 at tap locations 188. Thus, tap locations 188 are the positions where tap interconnects 168 approach drain pillar 184 within interconnect structure 110. Again, the potential for undesirable feedback capacitance imposed upon the output metallization (i.e., drain pillar 184) from the input metallization (i.e., tap interconnects 168) is greatest at tap locations 188. Shield structures 186 positioned between drain pillar 184 and tap interconnects 168 can effectively block an electric field between tap interconnects 168 and drain pillar 184 to reduce the feedback capacitance caused by the proximity of tap interconnects 168 to drain pillar 184.

Only a single drain pillar 184 and two shield structures 186 are presented in FIG. 4 for clarity. However, it should be understood that transistor 100 may include a plurality of drain pillars 184 at tap locations 188 in accordance with the configuration of interdigitated drain and gate runners shown in FIG. 1. Therefore, transistor 100 can include a plurality of individual shield structures 186, wherein one of shield structures 186 is positioned at each of tap locations 188. Thus, each of shield structures 186 is strategically located periodically at tap locations 188 of a multiple runner interdigitated active device. Shield structures 186 are located only at tap locations 188 and their geometry is designed to be small to minimize the potential for additional input and output capacitance contributions from shield structures 186. Additionally, a total of five electrically conductive layers 120, 132, 148, 164, 180 and five dielectric layers 126, 140, 156, 174, and 182 are shown herein. It should be understood that an interconnect structure may include more than or less than the number of conductive and dielectric layers described herein, and shield structures may be suitably formed to extend through the dielectric layers toward the semiconductor substrate.

Figure 5:
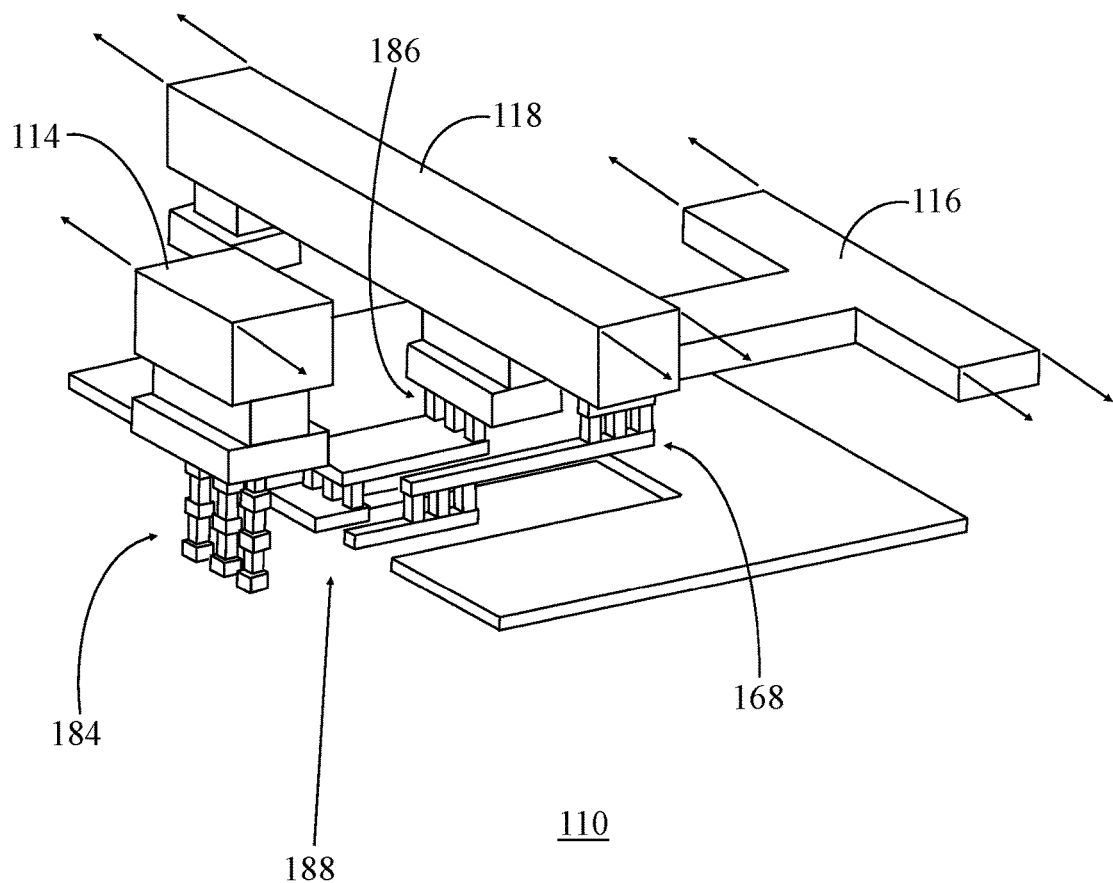
FIG. 5 shows a partial perspective view of the interconnect structure of FIG. 4.

FIG. 5 shows a partial perspective view of interconnect structure 110 of FIG. 4. More particularly, FIG. 5 shows one of tap locations 188 in which tap interconnect 168 is in proximity to drain pillar 184, with shield structure 186 strategically positioned between drain pillar 184 and tap interconnect 168. The various dielectric material layers surrounding drain pillar 184, shield structure 186, and tap interconnect 168 are not illustrated in FIG. 5 for clarity. Drain runner 114 is electrically connected to drain pillar 184, gate runner 116 is electrically connected to tap interconnect 168, and shield runner 118 (positioned between drain runner 114 and gate runner 116) is electrically connected to shield structure 186. Each of drain runner 114, gate runner 116, and shield runner 118 are illustrated with arrows pointing in opposing directions to signify that runners 114, 116, 118 extend in a lengthwise direction approximately parallel to one another.

Figure 6:
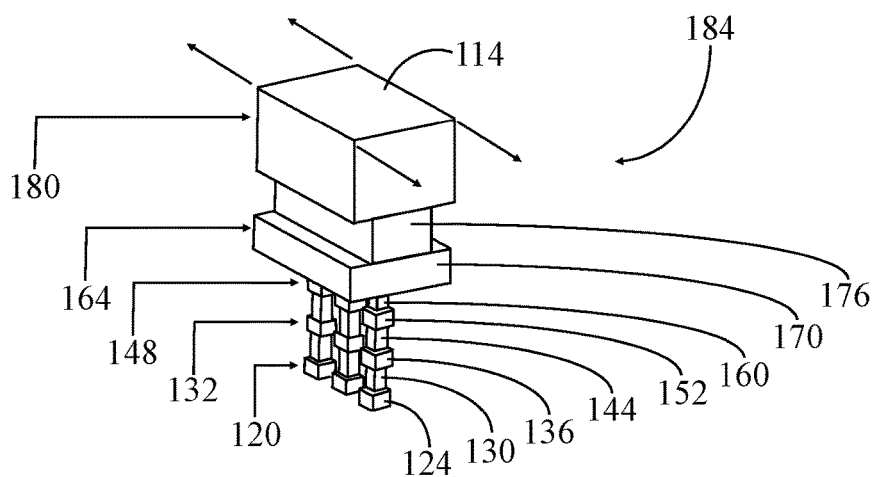
FIG. 6 shows a perspective view of a drain pillar within the interconnect structure.

FIG. 6 shows a perspective view of drain pillar 184 within interconnect structure 110 (FIG. 5). As shown, drain pillar 184 includes bottom drain segments 124 in bottom conductive layer 120. Drain segments 136 in first conductive layer 132 are connected to the underlying bottom drain segments 124 by conductive vias 130. Drain segments 152 in second conductive layer 148 are connected to the underlying drain segments 136 by conductive vias 144. Drain segments 170 in third conductive layer 164 are connected to the underlying drain segments 152 by conductive vias 160. Drain runner 114 in fourth conductive layer 180 is connected to the underlying drain segments 170 by conductive vias 176.

Figure 7:
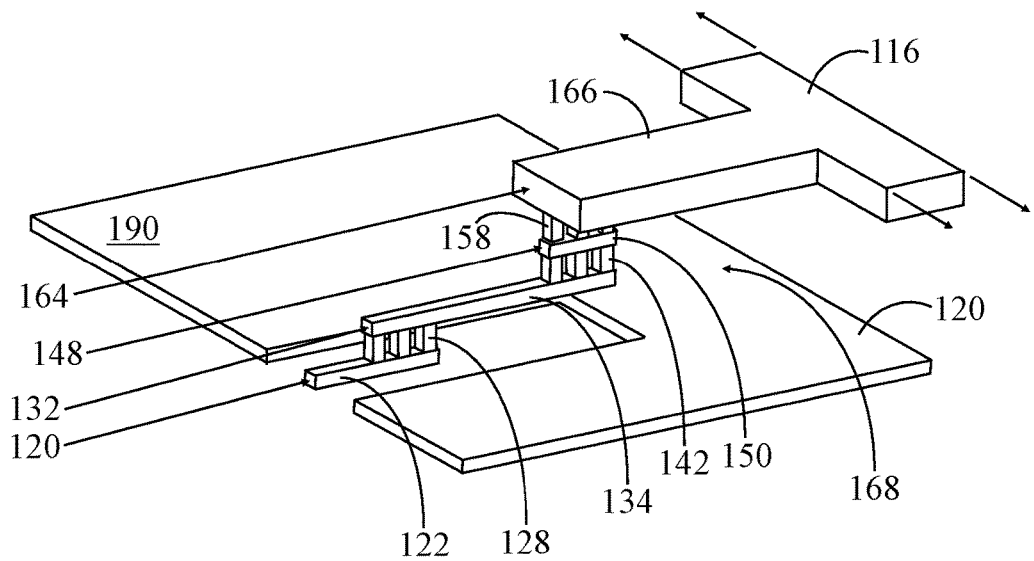
FIG. 7 shows a perspective view of a tap interconnect within the interconnect structure.

FIG. 7 shows a perspective view of tap interconnect 168 within interconnect structure 110 (FIG. 5). As shown, bottom tap segment 122 is formed in bottom conductive layer 120. However, bottom tap segment 122 is laterally spaced apart from and therefore electrically isolated from the surrounding material of bottom conductive layer 120. This surrounding material may be a ground plane 190 of transistor 100 (FIG. 4). Tap interconnect segment 134 in first conductive layer 132 is connected to the underlying bottom tap segment 122 by conductive vias 128. Tap interconnect segment 150 in second conductive layer 148 is connected to the underlying tap interconnect segment 134 by conductive vias 142. Gate finger 166, and therefore gate runner 116, in third conductive layer 164 is connected to the underlying tap interconnect 150 by conductive vias 158.

Figure 8:
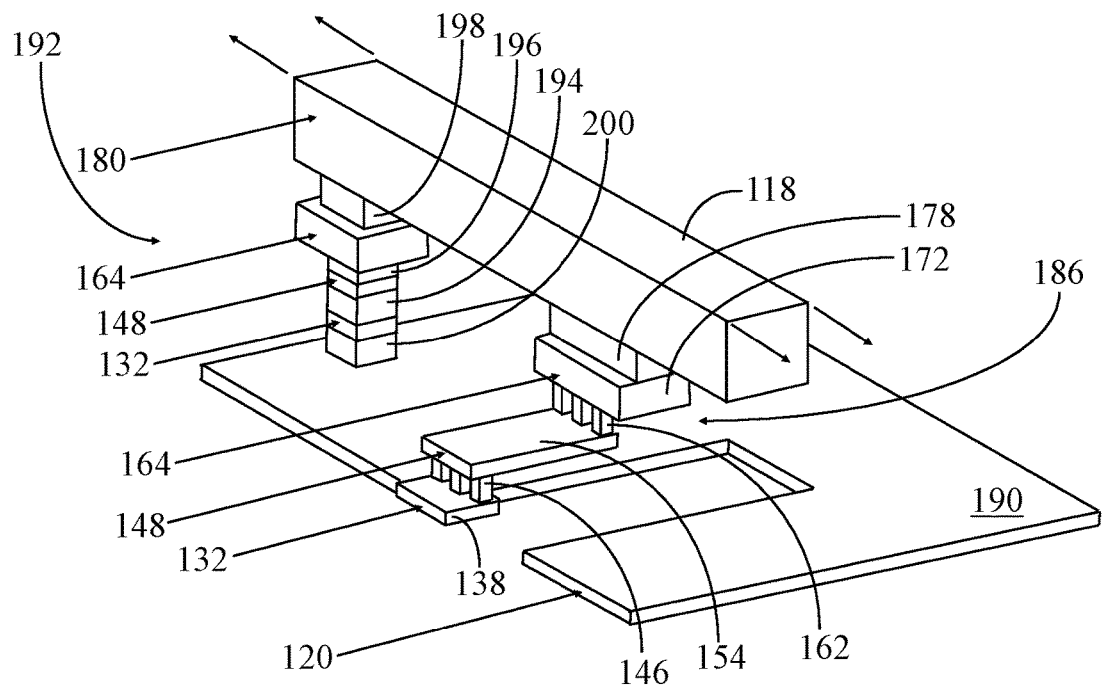
FIG. 8 shows a perspective view of a shield structure within the interconnect structure.

FIG. 8 shows a perspective view of shield structure 186 within interconnect structure 110 (FIG. 5). As shown, shield segment 138 is formed in first conductive layer 132. Shield segment 154 in second conductive layer 148 is connected to the underlying shield segment 138 by conductive vias 146. Shield segment 172 in third conductive layer 164 is connected to the underlying shield segment 154 by conductive vias 162. Shield runner 118 in fourth conductive layer 180 is connected to the underlying shield segment 172 by conductive vias 178.

It should be recalled that ground plane 190 may be formed in bottom conductive layer 120. Shield structure 186 is vertically spaced apart from bottom conductive layer 120. Accordingly, interconnect structure 110 further includes one or more shield pillars 192 (one shown) that electrically interconnects shield runner 118 to ground plane 190. Shield pillar 192 may be formed from electrically conductive layers 132, 148, and 164 interconnected by electrically conductive vias 194, 196, 198 and interconnected to ground plane 190 by another electrically conductive via 200. Shield pillars 192 are displaced away from shield structures 186 and hence away from tap locations 188 (FIG. 5). Shield pillars 192 serve as shunts to ground plane 190 in order to suitably ground shield structures 186. However, shield pillars 192 are displaced away from tap locations 188 to minimize the potential for input and output capacitance contributions from shield pillars 192.

Figure 9:
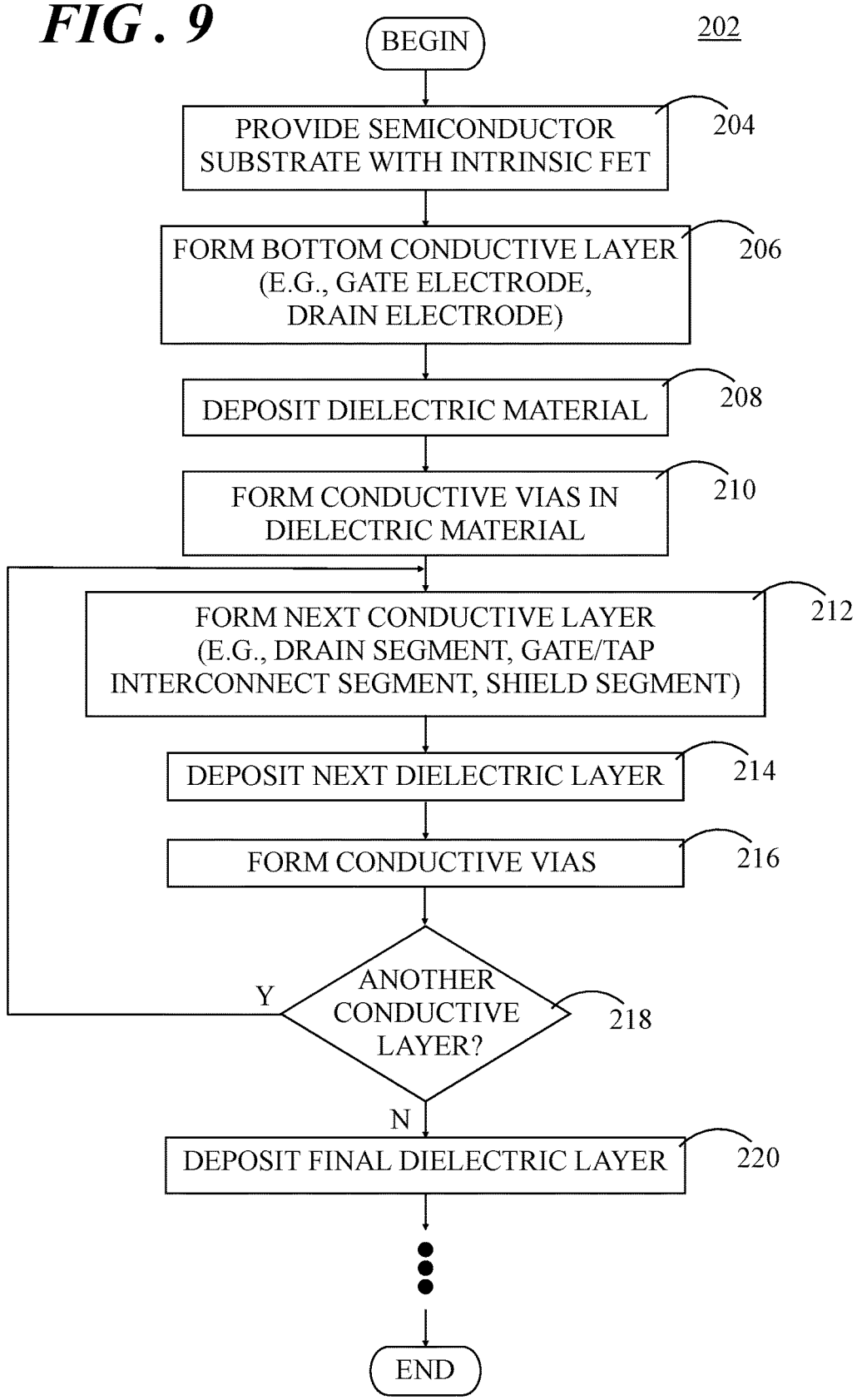
FIG. 9 shows a flowchart of a transistor manufacturing process in accordance with another embodiment.

FIG. 9 shows a flowchart of a transistor manufacturing process 202 in accordance with another embodiment. Transistor manufacturing process 202 may be implemented for fabricating one or more transistors, such as transistor 100 (FIG. 4) having a plurality of shield structures 186 (FIG. 4) formed therein. For ease of explanation, FIG. 4 should be viewed concurrently along with the ensuing description of transistor manufacturing process 202.

Process 202 may begin in a block 204 by providing a semiconductor substrate (e.g., semiconductor substrate 102) having one or more intrinsic active devices (e.g., FET 104) formed therein. The ensuing blocks 206-220 provide methodology for forming an interconnect structure (e.g., interconnect structure 110) having a plurality of shield structures (e.g., shield structures 186). In block 206, a bottom conductive layer (e.g., bottom conductive layer 120) may be formed on an upper surface (e.g., upper surface 112) of the semiconductor substrate. For example, in block 206, a conductive material such as a metal layer may be suitably deposited, patterned, and etched to yield the desired structures (e.g., bottom tap segment 122 and bottom drain segment 124 of FIG. 4 and ground plane 190 of FIG. 7) in the bottom conductive layer. In a block 208, a dielectric material layer (e.g., dielectric material layer 126) is deposited over the structures in the bottom conductive layer.

In a block 210, electrically conductive vias (e.g., vias 128, 130 of FIG. 4 and vias 200 of FIG. 8) extending through the bottom dielectric material layer are suitably produced by known and/or upcoming processes. In a block 212, a "next" conductive layer (e.g., first conductive layer 132) is formed on the bottom dielectric material layer. For example, in block 212, a conductive material such as a metal layer may be suitably deposited, patterned, and etched to yield the desired structures (e.g., tap interconnect segments 134, drain segments 136, shield segments 138 of FIG. 4 and a segment of shield pillar 192 of FIG. 8). In a block 214, a "next" dielectric material layer (e.g., first dielectric material layer 140) is deposited over the structures in the first conductive layer. In a block 216, a "next" set of electrically conductive vias (e.g., conductive vias 142, 144, 146 of FIG. 4 and conductive vias 194 of FIG. 8) are formed extending through the dielectric material layer.

In a query block 218, a determination is made as to whether the method entails forming another electrically conductive layer within the interconnect structure. When there is another electrically conductive layer, process flow loops back to block 212 to form the next conductive layer (e.g., second conductive layer 148), to block 214 to deposit the next dielectric layer (e.g., second dielectric material layer 156), and to block 216 to form the next set of conductive vias (e.g., conductive vias 158, 160, 162 of FIG. 4 and conductive vias 196 of FIG. 8). Accordingly, this process flow continues until the multiple layers of dielectric material and electrically conductive material are suitably processed.

When a determination is made at query block 218 that there are no further layers of electrically conductive material are to be processed, the method continues at a block 220. In block 220, a final dielectric layer (e.g., fourth dielectric layer 182) is deposited over the structure. Ellipses following block 220 indicate that other tasks may be performed such as testing, incorporating the transistor into a larger electrical system, and so forth.

Figure 10:
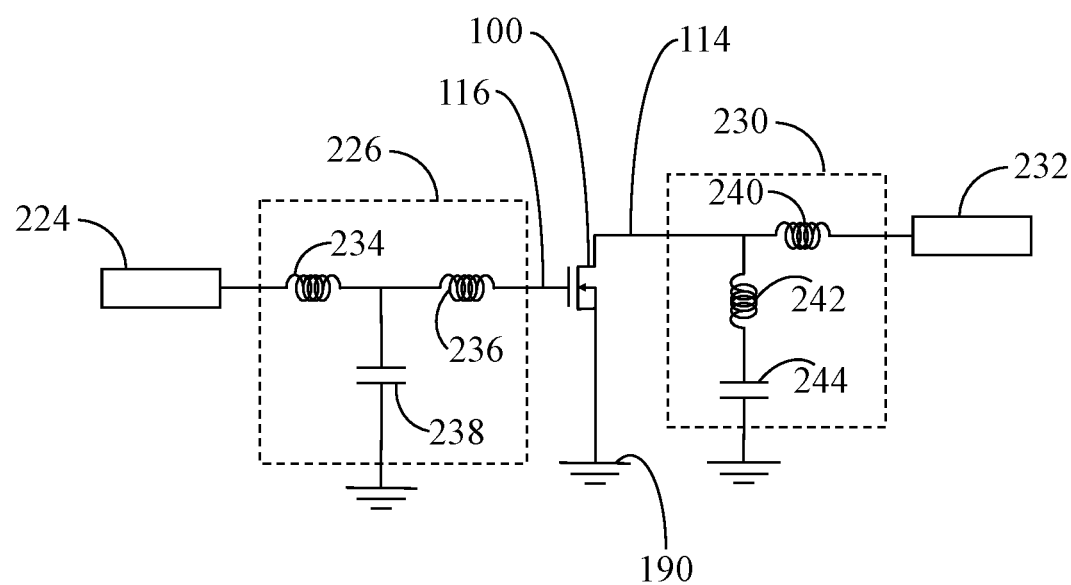
FIG. 10 shows a schematic diagram of amplifier path circuitry in which the transistor of FIG. 4 may be incorporated in accordance with an example embodiment.

Referring now to FIG. 10, FIG. 10 shows a schematic diagram of amplifier path circuitry 222 in which transistor 100 may be incorporated in accordance with an example embodiment. Device 222 includes an input lead 224, an input impedance matching circuit 226, transistor 100, an output impedance matching circuit 230, and an output lead 232. Although transistor 100 and various elements of the input and output impedance matching circuits 226, 230 are shown as singular components, the depiction is for the purpose of ease of explanation only. Those of skill in the art would understand, based on the description herein, that transistor 100 and/or certain elements of the input and output impedance matching circuits 226, 230 each may be implemented as multiple components (e.g., connected in parallel or in series with each other). For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads).

Input lead 224 and output lead 232 each include a conductor, which is configured to enable device 222 to be electrically coupled with external circuitry (not shown). More specifically, input and output leads 224, 232 may be physically located between the exterior and the interior of the device's package. Input impedance matching circuit 226 is electrically coupled between input lead 224 and a first terminal of transistor 100, which is also located within the device's interior, and output impedance matching circuit 230 is electrically coupled between a second terminal of transistor 100 and the output lead 232.

According to an embodiment, transistor 100 is the primary active component of device 222. Transistor 100 includes a control terminal and two current conducting terminals, where the current conducting terminals are spatially and electrically separated by a variable-conductivity channel. For example, transistor 100 may be a field effect transistor (FET) (such as a metal oxide semiconductor FET (MOSFET)), which includes gate runners 116 (control terminal), drain runners 114 (a first current conducting terminal), and a source (a second current conducting terminal). According to an embodiment, and using nomenclature typically applied to MOSFETs in a non-limiting manner, the gate runners 116 of transistor 100 are coupled to input impedance matching circuit 226, drain runners 114 of transistor 100 are coupled to output impedance matching circuit 230, and the source of transistor 100 is coupled to ground plane 190 (or another voltage reference). Through the variation of input control signals provided to gate runners 116 of transistor 100, the current between the current conducting terminals of transistor 100 may be modulated.

Input impedance matching circuit 226 may be configured to raise the impedance of device 222 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 226 is coupled between input lead 224 and the control terminal (e.g., gate runners 116) of transistor 100. In an example, input impedance matching circuit 226 includes two inductive elements 234, 236 (e.g., two sets of wirebonds) and a shunt capacitor 238. A first inductive element 234 (e.g., a first set of wirebonds) is coupled between input lead 224 and a first terminal of capacitor 238, and a second inductive element 236 (e.g., a second set of wirebonds) is coupled between the first terminal of capacitor 238 and the control terminal (e.g., gate runners 116) of transistor 100. The second terminal of capacitor 238 is coupled to ground (or another voltage reference). Thus, the combination of inductive elements 234, 236 and shunt capacitor 238 functions as a low-pass filter.

Output impedance matching circuit 230 may be configured to match the output impedance of device 222 with the input impedance of an external circuit or component (not shown) that may be coupled to output lead 232. Output impedance matching circuit 230 is coupled between the first current conducting terminal (e.g., drain runners 114) of transistor 100 and output lead 232. In an example, output impedance matching circuit 230 includes two inductive elements 240, 242 (e.g., two sets of wirebonds) and one capacitor 244. A first inductive element 240 (e.g., a third set of wirebonds) is coupled between the first current conducting terminal (e.g., drain runners 114) of transistor 100 and output lead 232. A second inductive element 242 (e.g., a fourth set of wirebonds) is coupled between the first current conducting terminal (e.g., drain runners 114) of transistor 100 and a first terminal of capacitor 244. A second terminal of capacitor 244 is coupled to ground (or to another voltage reference). Inductor 242 and capacitor 244 are coupled in series between a current conducting terminal (e.g., drain runners 114) of transistor 100 and ground, and this combination of impedance matching elements functions as a high-pass matching stage.

Figure 11:
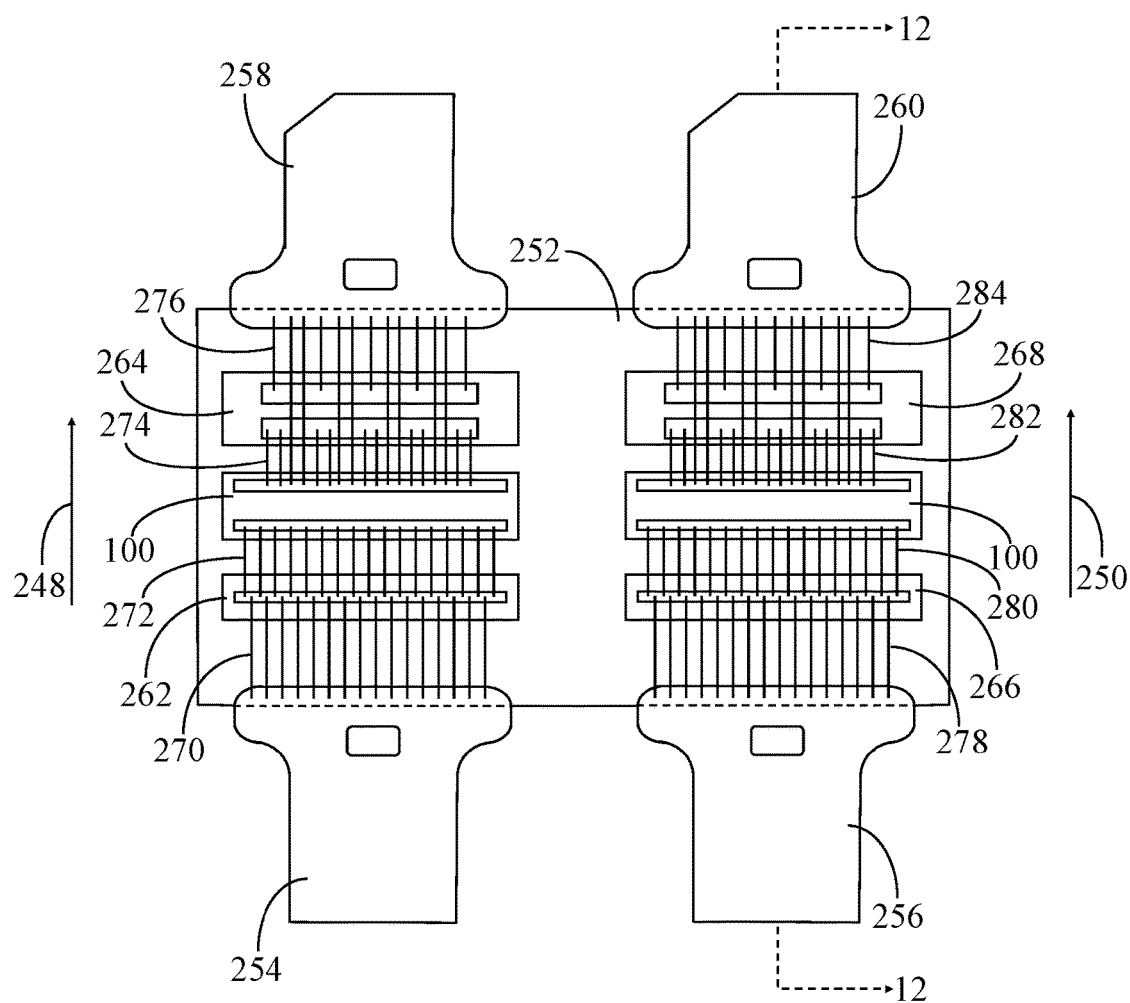
FIG. 11 shows a top view of an example of a packaged RF amplifier device incorporating the transistor of FIG. 4.
Figure 12:
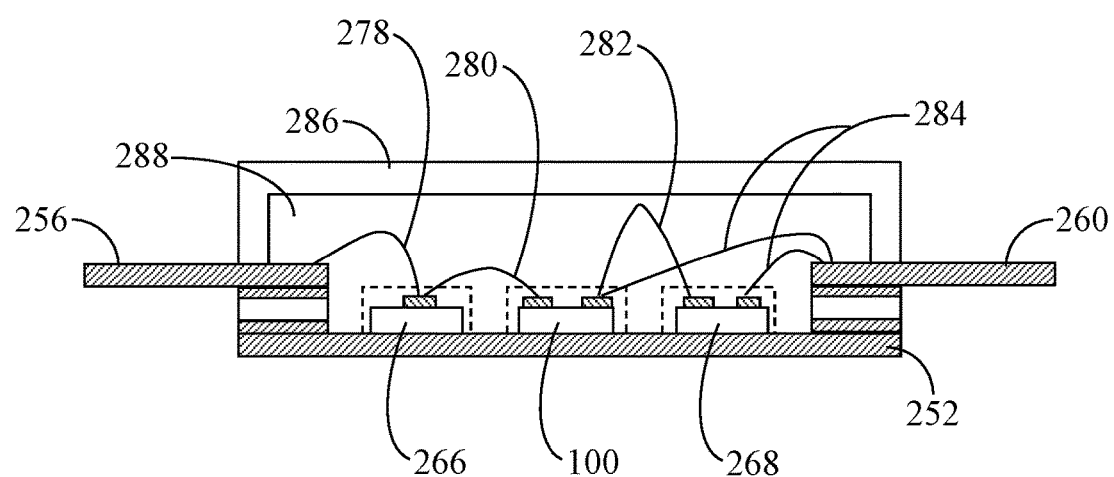
FIG. 12 shows a cross-sectional, side view of the packaged RF amplifier device of FIG. 11 along line 12-12.

Referring to FIGS. 11-12, FIG. 11 shows a top view of an example of a packaged RF amplifier device 246 incorporating transistor 100 and FIG. 12 shows a cross-sectional, side view of packaged RF amplifier device along line 12-12 of FIG. 11. More specifically, packaged RF amplifier device 246 includes first circuitry associated with a first amplifier path 248 and second circuitry associated with a second amplifier path 250. First amplifier path 248 may be a carrier path of a Doherty amplifier and second amplifier path 250 may be a peaking path of the Doherty amplifier, for example. In alternate embodiments, amplifier paths 248, 250 can form portions of a different type of amplifier. In another alternate embodiment, second circuitry associated with second amplifier path 250 may be excluded from the device.

RF amplifier device 246 includes a device substrate 252, input leads 254, 256, output leads 258, 260, two transistor dies 100, and passive components 262, 264, 266, 268 coupled to the top surface of the device substrate 252. In addition, device 246 includes multiple sets of wirebonds 270, 272, 274, 276, 278, 280, 282, 284 that electrically interconnect the leads, 254, 256, 258, 260, transistor dies 100, and components 262, 264, 266, 268. Each set of wirebonds 270, 272, 274, 276, 278, 280, 282, 284 is formed from a plurality of parallel, closely-spaced bonding wires. Although certain numbers and arrangements of wirebonds 270, 272, 274, 276, 278, 280, 282, 284 are depicted in FIG. 11, the numbers and/or arrangements of wirebonds may be different from that illustrated. Further, each set of wirebonds 270, 272, 274, 276, 278, 280, 282, 284 constitutes an inductive element, and therefore the wirebonds may be referred to below as "inductive elements" rather than "wirebonds." A cap 286 visible in FIG. 12 may be implemented in an air cavity package to seal the interior components of packaged RF amplifier device 246 within an air cavity 288 also visible in FIG. 12.

The amplifier path circuitry shown in FIG. 10 may be used as either of carrier path circuitry of first amplifier path 248 and/or as peaking path circuitry of second amplifier path 250. Thus, input lead 254, passive components 262, 264, one of transistors 100, inductive elements 270, 272, 274, 276, and output lead 258 of first amplifier path 248 can correspond to input lead 224, input impedance matching circuit 226, transistor 100, output impedance matching circuit 230 and output lead 232 of amplifier path circuitry 222 of FIG. 10. Likewise, input lead 256, passive components 266, 268, one of transistors 100, inductive elements 278, 280, 282, 284, and output lead 260 of second amplifier path 250 can correspond to input lead 224, input impedance matching circuit 226, transistor 100, output impedance matching circuit 230 and output lead 232 of amplifier path circuitry 222 of FIG. 10. Thus, further details of first and second amplifier paths 248, 250 are not provided herein for brevity.

Although embodiments have been described herein with respect to a Doherty power amplifier with one carrier amplifier and one peaking amplifier, those of skill in the art would understand, based on the description herein, that embodiments of the inventive subject matter may be used in conjunction with virtually any type of multiple path amplifier. Accordingly, the transistor having the shield structures described herein is not limited to use with Doherty amplifiers, nor is they limited to use with amplifiers having only two amplification paths. Rather, the transistor may be implemented within a wide variety of circuits.

An embodiment of a transistor comprises a semiconductor substrate having a first terminal and a second terminal, and an interconnect structure on an upper surface of the semiconductor substrate, the interconnect structure being formed of multiple layers of dielectric material and electrically conductive material. The interconnect structure includes a pillar formed from the electrically conductive material, the pillar being in electrical contact the first terminal, the pillar extending through the dielectric material, and a tap interconnect formed from the electrically conductive material, the tap interconnect being in electrical contact with the second terminal, the tap interconnect extending through the dielectric material. The interconnect structure further includes a shield structure formed from the electrically conductive material, the shield structure extending through the dielectric material toward the semiconductor substrate, the shield structure being positioned between the pillar and the tap interconnect.

An embodiment of a packaged radio frequency (RF) amplifier device comprises a device substrate, an input lead coupled to the device substrate, an output lead coupled to the device substrate, and a transistor coupled to a top surface of the device substrate. The transistor comprises a semiconductor substrate having a first terminal and a second terminal, and an interconnect structure on an upper surface of the semiconductor substrate, the interconnect structure being formed of multiple layers of dielectric material and electrically conductive material. The interconnect structure includes a pillar formed from the electrically conductive material, the pillar being in electrical contact the first terminal, the pillar extending through the dielectric material, and a tap interconnect formed from the electrically conductive material, the tap interconnect being in electrical contact with the second terminal, the tap interconnect extending through the dielectric material. The interconnect structure further includes a shield structure formed from the electrically conductive material, the shield structure extending through the dielectric material toward the semiconductor substrate, the shield structure being positioned between the pillar and the tap interconnect.

An embodiment of a method of manufacturing a transistor comprises providing a semiconductor substrate having a first terminal and a second terminal, and forming an interconnect structure on an upper surface of the semiconductor substrate of multiple layers of dielectric material and electrically conductive material. The forming the interconnect structure comprises forming a pillar from the electrically conductive material, the pillar electrically contacting the first terminal, and the pillar extending through the dielectric material, forming a tap interconnect from the electrically conductive material, the tap interconnect electrically contacting the second terminal, the tap interconnect extending through the dielectric material, and forming a shield structure from the electrically conductive material, the shield structure extending through the dielectric material toward the semiconductor substrate, the shield structure being positioned between the pillar and the tap interconnect.

Accordingly, embodiments disclosed herein entail a transistor, having a shield structure within an interconnect structure of the transistor, a packaged semiconductor device having such a transistor, and a method of manufacturing the transistor. More specifically, embodiments can include multiple shield structures strategically located along the runners of a multiple runner interdigitated transistor near positions where the input interconnections approach the output interconnections (tap locations). The shield structure includes several layers of grounded electrically conductive material, i.e., metal, and vias extending through the interconnect structure to block electric fields between the input signal tapped from a first runner and the output signal carried to a second runner of the transistor. The geometry of the shield structure is configured to be small to minimize additional input and output capacitance contributions from the shield structure. The geometry of the shield structure effectively increases the gain of the active device (e.g., transistor) without degrading stability by reducing feedback capacitance. The shield structure may be implemented within a wide variety of unipolar and bipolar transistor technologies. Additionally, the shield structure may be implemented within various interconnect structures for the transistors having more than or less than the quantity of electrically conductive and dielectric layers shown herein.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
  a semiconductor substrate having a first terminal and a second terminal; and
  an interconnect structure on an upper surface of said semiconductor substrate, said interconnect structure being formed of multiple layers of dielectric material and electrically conductive material, wherein said interconnect structure comprises:
    a pillar formed from said electrically conductive material, said pillar being in electrical contact said first terminal, said pillar extending through said dielectric material;
    a tap interconnect formed from said electrically conductive material, said tap interconnect being in electrical contact with said second terminal, said tap interconnect extending through said dielectric material; and
    a shield structure formed from said electrically conductive material, said shield structure extending through said dielectric material toward said semiconductor substrate, said shield structure being positioned between said pillar and said tap interconnect wherein said tap interconnect forms a portion of an input to said second terminal, said pillar forms a portion of an output from said first terminal, and said shield structure is configured to block an electric field between said tap interconnect and said pillar.

2. The transistor of claim 1 wherein said shield structure is laterally spaced apart and electrically isolated from said pillar by said dielectric material.

3. The transistor of claim 1 wherein said shield structure is laterally spaced apart and electrically isolated from said tap interconnect by said dielectric material.

4. The transistor of claim 1 wherein said shield structure is vertically spaced apart and electrically isolated from said upper surface of said semiconductor substrate by said dielectric material.

5. A transistor comprising:
  a semiconductor substrate having a first terminal and a second terminal; and
  an interconnect structure on an upper surface of said semiconductor substrate, said interconnect structure being formed of multiple layers of dielectric material and electrically conductive material, wherein said interconnect structure comprises:
- a pillar formed from said electrically conductive material, said pillar being in electrical contact said first terminal, said pillar extending through said dielectric material;
- a tap interconnect formed from said electrically conductive material, said tap interconnect being in electrical contact with said second terminal, said tap interconnect extending through said dielectric material;
- a shield structure formed from said electrically conductive material, said shield structure extending through said dielectric material toward said semiconductor substrate, said shield structure being positioned between said pillar and said tap interconnect;
- a first runner electrically connected to said pillar;
- a second runner electrically connected to said tap interconnect; and
- a shield runner positioned between said first runner and said second runner, said shield runner being electrically connected to said shield structure.

6. The transistor of claim 5 wherein said interconnect structure further comprises:
- a plurality of tap interconnects contacting said second terminal and extending through said dielectric material, one said tap interconnects being formed at each of a plurality of tap locations between said second terminal and said second runner; and
- a plurality of shield structures, wherein one of said shield structures is positioned at each of said tap locations.

7. The transistor of claim 5 wherein:
said tap interconnect extends laterally toward said pillar in said dielectric material below said shield runner; and
said shield structure extends laterally toward said pillar in said dielectric material so that said shield structure remains positioned between said pillar and said tap interconnect.

8. The transistor of claim 5 further comprising a shield pillar electrically interconnecting said shield runner with a ground plane, said shield pillar being displaced away from said shield structure.

9. A transistor comprising:
a semiconductor substrate having a first terminal and a second terminal; and
an interconnect structure on an upper surface of said semiconductor substrate, said interconnect structure being formed of multiple layers of dielectric material and electrically conductive material, wherein said interconnect structure comprises:
- a pillar formed from said electrically conductive material, said pillar being in electrical contact said first terminal, said pillar extending through said dielectric material;
- a tap interconnect formed from said electrically conductive material, said tap interconnect being in electrical contact with said second terminal, said tap interconnect extending through said dielectric material; and
- a shield structure formed from said electrically conductive material, said shield structure extending through said dielectric material toward said semiconductor substrate, said shield structure being positioned between said pillar and said tap interconnect; wherein
  said electrically conductive material of said interconnect structure includes a first layer and a second layer spaced apart by a first dielectric material layer of said dielectric material;
  said tap interconnect includes a first segment of said first layer, a second segment of said second layer, and a first electrically conductive via extending through said first dielectric material layer connecting said first and second segments; and
  said shield structure includes a third segment of said first layer, a fourth segment of said second layer and a second electrically conductive via extending through said first dielectric material layer, wherein said third segment is positioned between said first segment and said pillar and said fourth segment is positioned between said second segment and said pillar.

10. The transistor of claim 9 wherein:
said electrically conductive material of said interconnect structure further includes a third layer spaced apart from said second layer by a second dielectric material layer of said dielectric material;
a runner is formed in a fifth segment of said third layer, said runner being electrically connected to said second segment of said second layer by a third electrically conductive via extending through said second dielectric material layer; and
said shield structure includes a sixth segment of said third layer, said sixth segment being electrically connected to said fourth segment by a fourth electrically conductive via extending through said second dielectric material layer, said sixth segment being positioned between said runner and said pillar.

11. The transistor of claim 10 further comprising:
a shield runner spaced apart from said sixth segment of said third layer by a third dielectric material layer of said dielectric material, said shield runner being electrically connected to said sixth segment by a fifth electrically conductive via; and
another runner spaced apart from said pillar by said third dielectric material layer, said another runner being electrically connected to said pillar by a sixth electrically conductive via, wherein said shield runner is formed in the same plane and is adjacent to said another runner.

12. A packaged radio frequency (RF) amplifier device comprising:
a device substrate;
an input lead coupled to said device substrate;
an output lead coupled to said device substrate; and
a transistor coupled to a top surface of said device substrate, said transistor including:
  a semiconductor substrate having a first terminal and a second terminal; and
  an interconnect structure on an upper surface of said semiconductor substrate, said interconnect structure being formed of multiple layers of dielectric material and electrically conductive material, wherein said interconnect structure comprises:
    a pillar formed from said electrically conductive material, said pillar being in electrical contact said first terminal, said pillar extending through said dielectric material;
    a tap interconnect formed from said electrically conductive material, said tap interconnect being in electrical contact with said second terminal, said tap interconnect extending through said dielectric material;

a shield structure formed from said electrically conductive material, said shield structure extending through said dielectric material toward said semiconductor substrate, said shield structure being positioned between said pillar and said tap interconnect;

a first runner electrically connected to said pillar;

a second runner electrically connected to said tap interconnect; and a shield runner positioned between said first runner and said second runner, said shield runner being electrically connected to said shield structure.

13. The packaged RF amplifier device of claim 12 wherein said interconnect structure further comprises:

a plurality of tap interconnects electrically contacting said second terminal and extending through said dielectric material, one said tap interconnects being formed at each of a plurality of tap locations between said second terminal and said second runner; and a plurality of shield structures, wherein one of said shield structures is positioned at each of said tap locations.

14. The packaged RF amplifier device of claim 12 wherein:

said tap interconnect extends laterally toward said pillar in said dielectric material below said shield runner; and said shield structure extends laterally toward said pillar in said dielectric material so that said shield structure remains positioned between said pillar and said tap interconnect.

15. The packaged RF amplifier device of claim 12 further comprising a shield pillar electrically interconnecting said shield runner with a ground plane, said shield pillar being laterally displaced away from said shield structure.

16. A method of manufacturing a transistor comprising:

providing a semiconductor substrate having a first terminal and a second terminal; and forming an interconnect structure on an upper surface of said semiconductor substrate of multiple layers of dielectric material and electrically conductive material, said forming said interconnect structure comprising:

forming a pillar from said electrically conductive material, said pillar electrically contacting said first terminal, and said pillar extending through said dielectric material;

forming a tap interconnect from said electrically conductive material, said tap interconnect electrically contacting said second terminal, said tap interconnect extending through said dielectric material;

forming a shield structure from said electrically conductive material, said shield structure extending through said dielectric material toward said semiconductor substrate, said shield structure being positioned between said pillar and said tap interconnect;

forming a first runner electrically connected to said pillar;

forming a second runner electrically connected to said tap interconnect;

forming a shield runner positioned between said first runner and said second runner, said shield runner being electrically connected to said shield structure; and forming a shield pillar electrically interconnecting said shield runner with a ground plane, said shield pillar being displaced away from said shield structure.

17. The method of claim 16 wherein said forming said interconnect structure further comprises:

forming a plurality of tap interconnects contacting said second terminal and extending through said dielectric material, one of said tap interconnects being formed at each of a plurality of tap locations between said second terminal and said second runner; and forming a plurality of shield structures, wherein one of said shield structures is positioned at each of said tap locations.

* * * * *